(12) United States Patent
Birke et al.

(10) Patent No.: US 9,870,035 B2
(45) Date of Patent: Jan. 16, 2018

(54) DEVICE FOR HIGH DENSITY CONNECTIONS

(71) Applicant: International Business Machines Corporation, Armonk, NY (US)

(72) Inventors: Robert Birke, Kilchberg (CH); Yiyu L. Chen, Thalwil (CH); Martin L. Schmatz, Rueschlikon (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/788,866

(22) Filed: Jul. 1, 2015

(65) Prior Publication Data
US 2017/0003722 A1    Jan. 5, 2017

(51) Int. Cl.
*H05K 7/00* (2006.01)
*G06F 1/18* (2006.01)
*H05K 7/14* (2006.01)

(52) U.S. Cl.
CPC ........... *G06F 1/186* (2013.01); *H05K 7/1444* (2013.01); *H05K 7/1487* (2013.01)

(58) Field of Classification Search
None
See application file for complete search history.

(56) References Cited

U.S. PATENT DOCUMENTS

| | | | | | |
|---|---|---|---|---|---|
| 3,671,917 A | * | 6/1972 | Ammon | ............... | H01R 12/721 439/62 |
| 3,868,166 A | * | 2/1975 | Ammon | ............... | H01R 12/716 439/634 |
| 5,334,029 A | | 8/1994 | Akkapeddi et al. | | |
| 5,967,824 A | * | 10/1999 | Neal | ............. | G06F 1/184 439/157 |
| 5,980,281 A | * | 11/1999 | Neal | ............. | G06F 1/184 439/157 |
| 6,109,929 A | * | 8/2000 | Jasper | ............. | G06F 1/184 361/790 |

(Continued)

OTHER PUBLICATIONS

Pitwon et al., "Design and implementation of an electro-optical backplane with pluggable in-plane connectors," 12 pages, http://discovery.ucl.ac.uk/1909512/19095_SPIE_7607-18_Xyratex18.pdf.

(Continued)

*Primary Examiner* — Courtney Smith
*Assistant Examiner* — Rashen E Morrison
(74) *Attorney, Agent, or Firm* — Nicholas D. Bowman

(57) ABSTRACT

A device is described. The device includes a daughterboard having a first distinct side and a second distinct side. A first connector on the first distinct side is attached to a first baseboard. A second connector on the second distinct side is attached to a second baseboard. A method for attaching a daughterboard to a second device is described. Connectors are included on opposing distinct sides of the daughterboard. The second device includes baseboards mechanically secured in parallel by lead screw actuators. As part of the method, the lead screw actuators are actuated so as to move the baseboards away from each other. A first connector is attached to one of the baseboards. The lead screw actuators are again actuated so as to move the baseboards toward each other until a second connector is brought into attachment with the other of the baseboards.

17 Claims, 6 Drawing Sheets

(56) References Cited

U.S. PATENT DOCUMENTS

| | | | | |
|---|---|---|---|---|
| 6,162,073 A * | 12/2000 | Haq | G06F 1/184 | 439/159 |
| 6,288,911 B1 * | 9/2001 | Aoki | H05K 7/1409 | 211/41.17 |
| 6,381,164 B1 * | 4/2002 | Fan | G11O 5/063 | 257/E23.067 |
| 6,587,354 B1 * | 7/2003 | Kutsch | H04Q 1/023 | 361/788 |
| 6,590,159 B2 | 7/2003 | Fan et al. | | |
| 6,657,871 B2 * | 12/2003 | Perino | G06F 13/409 | 257/686 |
| 6,661,690 B2 * | 12/2003 | Moriarty | G11O 5/04 | 365/52 |
| 6,674,649 B2 * | 1/2004 | McCall | H05K 1/14 | 257/723 |
| 6,805,560 B1 * | 10/2004 | Budny | H01R 12/52 | 439/65 |
| 7,358,603 B2 | 4/2008 | Li et al. | | |
| 7,883,367 B1 | 2/2011 | Kline | | |
| 7,918,683 B1 * | 4/2011 | Hamner | G06F 1/185 | 439/377 |
| 8,379,403 B2 * | 2/2013 | Waite | G01R 1/06772 | 257/726 |
| 8,650,343 B1 * | 2/2014 | Kanapathippillai | G06F 13/1657 | 710/62 |
| 8,662,925 B2 | 3/2014 | Gao et al. | | |
| 8,689,042 B1 * | 4/2014 | Kanapathippillai | G06F 13/1657 | 714/6.22 |
| 8,760,881 B2 * | 6/2014 | Saito | H05K 7/1461 | 361/679.01 |
| 8,814,595 B2 | 8/2014 | Cohen et al. | | |
| 9,370,118 B2 * | 6/2016 | Li | H05K 7/1409 | |
| 9,373,914 B2 * | 6/2016 | Li | G06F 1/185 | |
| 2005/0160207 A1 * | 7/2005 | Chen | G06F 13/409 | 710/74 |
| 2006/0277343 A1 * | 12/2006 | Lin | G06F 1/185 | 710/301 |
| 2008/0040527 A1 * | 2/2008 | Filipov | G06F 1/1632 | 710/303 |
| 2009/0067136 A1 * | 3/2009 | Cheney | H05K 7/1431 | 361/726 |
| 2009/0180264 A1 * | 7/2009 | Chiang | H05K 7/142 | 361/752 |
| 2010/0062649 A1 | 3/2010 | Wu et al. | | |
| 2014/0160664 A1 * | 6/2014 | Yang | G06F 1/185 | 361/679.32 |
| 2014/0273551 A1 * | 9/2014 | Resendez | H01R 12/737 | 439/65 |
| 2015/0205745 A1 * | 7/2015 | Bailey | G06F 13/385 | 710/315 |
| 2016/0012006 A1 * | 1/2016 | Motamedi | G06F 11/328 | 710/301 |
| 2017/0179652 A1 | 6/2017 | Stokoe et al. | | |

OTHER PUBLICATIONS

Isola, "DURAVER®-E-Cu quality 104i quality 104i ML; DURAVER®-E-Cu quality 104 KF" 8 pages, http://www.multi-circuit-boards.eu/fileadmin/user_upload/downloads/e_isola_duraver-e-cu-104i_www.multi-circuit-boards.eu.pdf.

Bell, G., "A Seymour Cray Perspective," Seymour Cray Lecture Series, University of Minnesota, Nov. 10, 1997, CDC 6600 Cordwood module, Slide 34, http://research.microsoft.com/en-us/um/people/gbell/craytalk/sld034.htm.

Molex Incorporated, "DDR3 DIMM, 1.00MM Pitch 240 CKTS, Vertical T/H," Document No. SD-78079-001, 8 pages, http://www.molex.com/pdm_docs/sd/780790001_sd.pdf.

Wera, "7440/41/42 Kraftform torque screwdriver set 0.3-6.0 Nm," Wera Tools. From Ideas., 2 pages http://www-us.wera.de/product_detail_us.html?L=1&file=root_category_torque_tools_series_7400_kraftform_torque_screwdrivers_variable_torque_adjustment_modeIs_7440_41_42&lang=en-US.

* cited by examiner

DEVICE FOR HIGH DENSITY CONNECTIONS

BACKGROUND

Embodiments of the invention relate in general to the field of devices for high density connections.

A limiting factor to dense computer systems or integrated systems is the density of connections between components, especially between baseboards and daughterboards. For instance, peripheral component interface express (PCIe) is a connector standard developed for connecting extension cards (e.g. graphical cards) with a motherboard, and this connector standard has lower I/O pin count and smaller physical footprint compared to older standards. The most common practice involves connectors that rely on a single edge of contact design: the daughterboard has an angle of ninety degrees about the baseboard when inserted with the connector. For instance, PCIe, peripheral component interface (PCI), and double data rate (DDR) modules rely on this design.

However, the decrease of the physical foot print of the connector on the baseboard implies a smaller contact area between the baseboard and the daughterboard. This involves connectors having higher densities and expensive multilayer printed circuit boards (PCBs) that are combined with complex PCB design techniques to be able to route signals to these high density connectors.

SUMMARY

According to embodiments, aspects of the disclosure may include a device. The device includes a daughterboard having a first distinct side and a second distinct side. A first connector on the first distinct side is attached to a first baseboard. A second connector on the second distinct side is attached to a second baseboard.

According to embodiments, further aspects of the disclosure may include a method for attaching a daughterboard to a device. A first connector is included on a first distinct side of the daughterboard and a second connector is included on a second distinct side of the daughterboard. The first and second distinct sides are opposite each other. The device includes a first baseboard mechanically secured in parallel with a second baseboard by one or more lead screw actuators. As part of the method, the one or more lead screw actuators are actuated so as to move the first baseboard away from the second baseboard. The first connector is attached to a first card slot of the first baseboard. The one or more lead screw actuators are again actuated so as to move the first baseboard toward the second baseboard until the second connector is brought into attachment with a second card slot of the second baseboard.

BRIEF DESCRIPTION OF THE DRAWINGS

These and other objects, features, and characteristics of the present invention will become more apparent to those skilled in the art from the following detailed description in conjunction with the appended claims and drawings, all of which form a part of this specification. In the drawings:

Similar or functionally similar elements in the figures have been allocated the same reference signs if not otherwise indicated.

DETAILED DESCRIPTION

Figure 1:
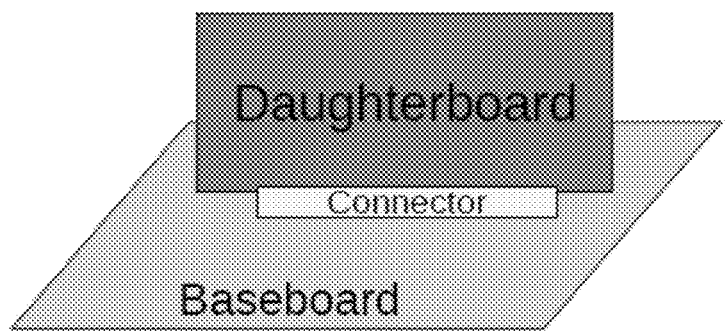
FIG. 1 shows an example of the single edge of contact design.

References in this specification to "an embodiment", "one embodiment", or the like, means that the particular feature, structure, or characteristic being described is included in at least one embodiment of the present invention. Occurrences of such phrases in this specification do not all necessarily refer to the same embodiment, however.

According to a first aspect, the present invention may be embodied as a device comprising a daughterboard with two or more connectors on distinct sides thereof, said connectors attached to a baseboard.

In embodiments, the device may further comprise a daughterboard with four distinct sides. In addition, each connector of a distinct side of the daughterboard may be attached to a respective baseboard positioned in front of the connector. Each respective baseboard positioned in front of a connector of the daughterboard may be communicatively coupled with at least one other respective baseboard. The baseboard may further comprise, for each connector of the daughterboard, a card slot for attaching the said each connector. The baseboard may further comprise two or more card slots mounted in parallel. The card slot may be a dual in-line memory module (DIMM).

In embodiments, the said each connector may be attached to the card slot with a circuit. The circuit may be a flexible flat cable or a flexible circuit. The daughterboard may comprise two connectors located on opposite sides of the daughterboard and wherein two baseboards are positioned opposite each other. The daughterboard may further comprise a third connector located on a side which connects the said two opposite sides, and wherein a third baseboard is positioned in front of the third connector.

In embodiments, the two baseboards may be mechanically secured to each other in the said position opposite each other. The two baseboards may be mechanically secured to each other by one or more linear actuators. The one or more linear actuators may be lead screw actuators. The one or more linear actuators may be motorized lead screw actuators. The number of daughterboards may depend on maximal flexural strength in the length direction and the cross direction of the baseboard.

In embodiments, the baseboard may comprise at least one processor communicatively coupled with a memory. The daughterboard may comprise at least one processor communicatively coupled with a memory. The device may be a blade server with a baseboard that provides non-core computing services to the daughterboards that are enclosed in blade enclosures with two or more connectors that are attached to the baseboard.

According to another aspect, the invention may be embodied as a method for attaching a daughterboard having two connectors on distinct sides on the above device. The method comprises actuating the one or more lead screw actuators to move the two baseboards from each other, attaching one of the connectors of the daughterboard to one of the baseboards, and actuating the one or more lead screw actuators to bring the two baseboards away from each other until the second connector of the daughterboard is attached to the other baseboard.

FIG. 1 shows a daughterboard having a single edge of contact with a baseboard.

It may be advantageous to overpass the single edge of contact design by extending the connections onto the other edges of the daughterboard. By this way, the area for connectors may be extended while relaxing the density requirements. It may thus be possible to decrease the costs of baseboards and daughterboards as less expensive connectors can be used while providing greater connectivity. Furthermore, the design of baseboards may be simplified so that shorter design periods are necessary for creating new baseboards. In addition, embodiments of the present invention can use simple mechanical aids to overcome mechanical limits such as high insertion force of multiple parallel connectors.

Building on this idea, a general aspect of embodiments of the invention is now described in reference to FIGS. 5A-5D, 6A-6C which figures concern devices that each comprise embodiments of a daughterboard with two or more connectors on distinct sides thereof, said connectors attached to a baseboard.

Figure 2A:
FIGS. 2A, 2B, 2C, and 2D show examples of configurations of a daughterboard with two connectors, in accordance with embodiments.
Figure 2B:
Figure 2C:
Figure 2D:
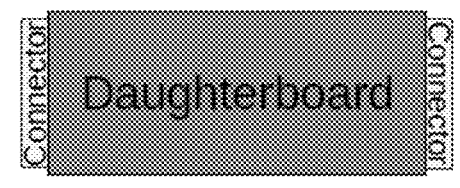
Figure 3A:
FIGS. 3A, 3B, 3C, and 3D show examples of configurations of a daughterboard with three connectors, in accordance with embodiments.
Figure 3B:
Figure 3C:
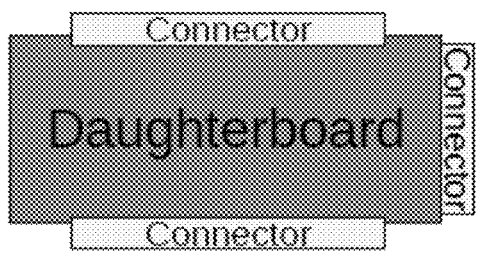
Figure 3D:
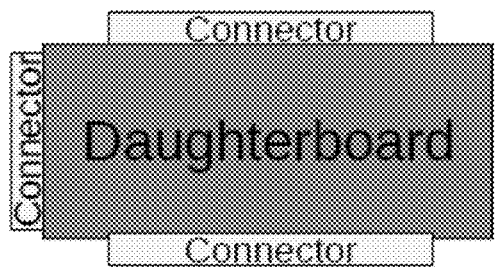

FIGS. 2A to 2D show embodiments of two-sided daughterboards, with each daughterboard comprising two connectors. FIGS. 2A and 2D show embodiments of a daughterboard of rectangular form with four distinct sides (also referred to as edges of the daughterboard) and two connectors that are located on opposite sides of the daughterboard. The configuration of FIG. 2A can be referred to as a top-bottom configuration, and the configuration of FIG. 2D can be referred to as a left-right configuration. FIGS. 2B and 2C show embodiments of a rectangular daughterboard with two connectors that are located on two connected (e.g., adjoining) sides of the daughterboard. The configuration of FIG. 2B can be referred to as a bottom-left configuration, and the configuration of FIG. 2C can be referred to as a bottom-right configuration. Here the references to top/bottom and left/right of the board are made according to an arbitrary orientation of the example rectangular daughterboard. It is to be understood that, in embodiments, the daughterboard might possibly have more than four sides, and in this case two configurations might be obtained: a first one where two connectors are located on connected sides (which configuration is similar to the configuration of FIG. 2B or 2C), and a second one where two connectors are located on two sides that are not connected (which configuration is similar to the configuration of FIG. 2A or 2D).

In embodiments, the term connector of a daughterboard designates a portion of a printed circuit board (PCB) consisting of traces leading to an edge of the board that are intended to plug into a matching slot, as known in the art. For instance, the connector of a daughterboard may be a single discrete male connector that can be plugged into a female connector that is placed on the baseboard. As another example, the connector of daughterboard may be a single discrete female connector that can be plugged into a male connector that is placed on the baseboard.

FIGS. 3A to 3D show embodiments of three-sided daughterboards, with each daughterboard comprising three connectors. In these four configurations, three consecutive and connected sides of a board may each comprise a connector. As previously mentioned, the daughterboard might possibly have more than four sides, and in this case all the four configurations could be applied.

Figure 4:
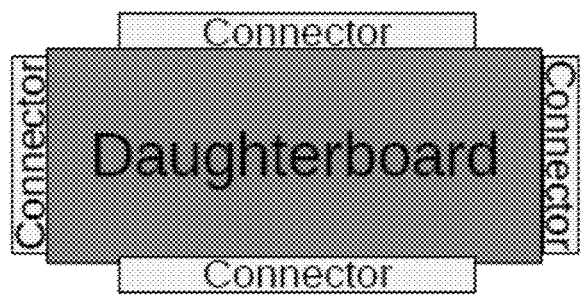
FIG. 4 shows an example of configurations of a daughterboard with four connectors, in accordance with embodiments.

FIG. 4 shows an embodiment of a four-sided daughterboard, and each side of the daughterboard has a connector.

Figure 5:
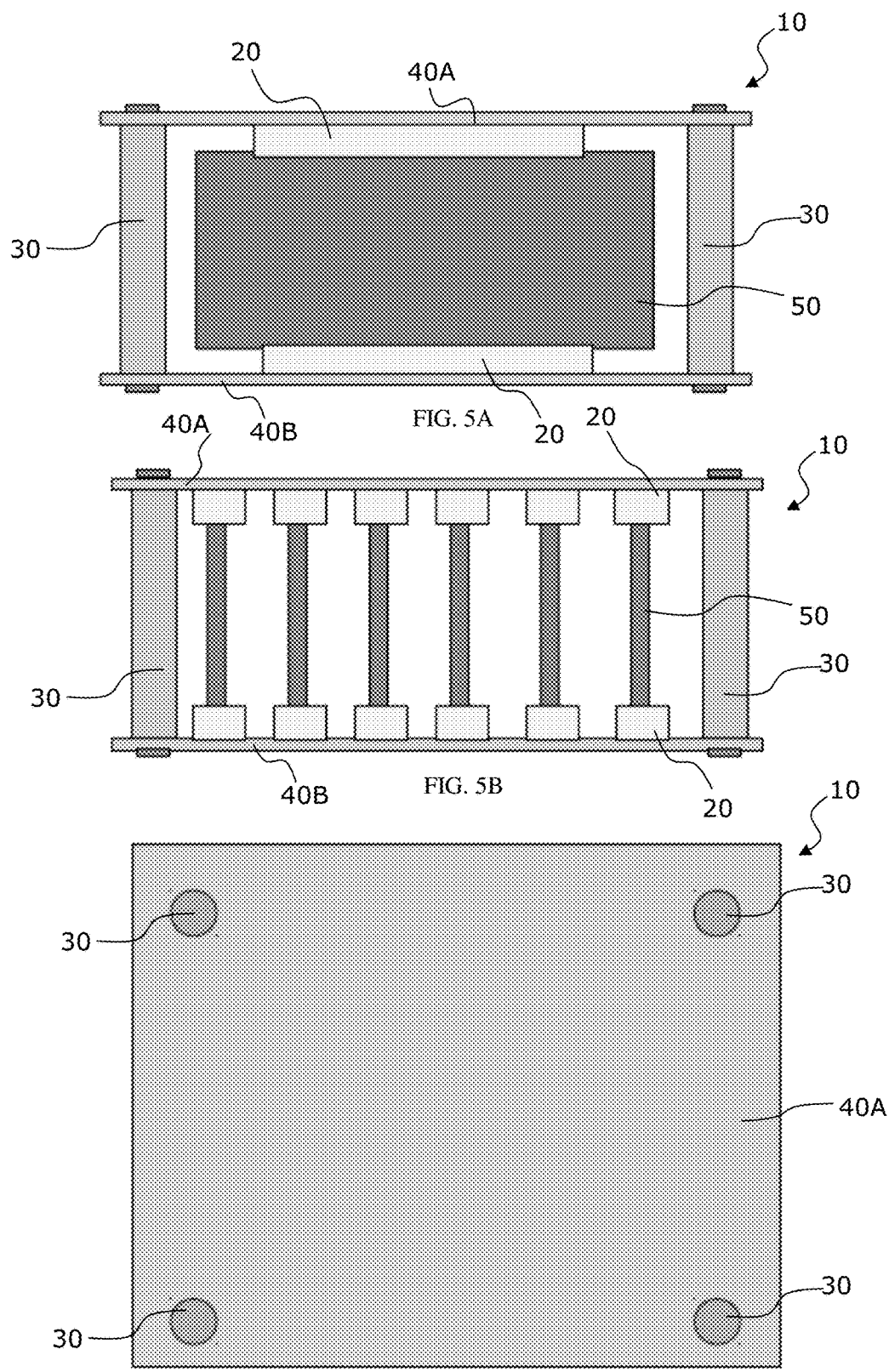
FIGS. 5A, 5B, and 5C show views of an embodiment of the invention for a daughterboard with two connectors.

Referring now to FIGS. 5A-5C, an embodiment of a device 10 is represented. As represented, the device comprises six two-sided daughterboards 50. FIG. 5A is a front view, FIG. 5B is a side view, and FIG. 5C is a top view of the device 10. The top and bottom connectors 20 of each daughterboard 50 are attached to the baseboards 40A, 40B. In this example, each connector of a daughterboard is attached to a respective baseboard positioned in alignment with the connector. Said otherwise, the connector of a first side (e.g. the top side) of the daughterboard is connected to a first baseboard (e.g., 40A) and the connector of a second side (e.g. the bottom side) of the daughterboard is connected to a second baseboard (e.g., 40B).

In embodiments, each baseboard comprises one or more card slots for attaching to a connector of a daughterboard. A card slot is a module that can receive the connector and establish electrical (or optical) connection with the connector of the daughterboard. For instance, the card slot may be a dual in-line memory module (DIMM) as specified by the standards of the Joint Electron Device Engineering Council (JEDEC). In such instances, the card slot may be of a type of DIMM (e.g., DIMM2, DIMM3). As another example, the PCI express standard may be used for connecting the baseboard and the daughterboard. Any type of card slot standard that provides electrical (or optical) contact between two boards can be used in embodiments of the present invention for attaching the daughterboard to the baseboard. Furthermore, in embodiments, a connector may be in contact with the card slot through a circuit, e.g., a flexible flat cable or a flexible circuit.

In the embodiment of FIGS. 5A-5C, the baseboard is comprised of two baseboards 40A, 40B that are positioned opposite each other. They are substantially parallel with respect to each other. Both baseboards are mechanically secured to each other in order to keep the daughterboards correctly attached to them. In particular, the distance between the two baseboards may be such that contacts between the top and bottom connectors of a daughterboard and the top and bottom baseboards, respectively, are achieved. The two baseboards may be fixed to a frame adapted to maintain boards in a stable position, e.g., a chassis of a server.

In embodiments, the two baseboards may be mechanically secured to each other with one or more linear actuators 30. A linear actuator is an actuator that creates motion in a straight line. By activating the one or more linear actuators, it may be possible to increase or decrease the distance between the two baseboards which may make easier the addition or the removal of a daughterboard. In embodiments, the first and second baseboards are rectangular in shape. The first end of a first linear actuator is attached at a first corner of the first baseboard, and the second end of the first linear actuator is attached at a first corner of the second baseboard. Similarly, the other three corners of the two baseboards may be linked together with linear actuators so that the configuration of FIGS. 5A-5C is obtained. These mechanical aids may help to overcome mechanical limits, such as high insertion forces for multiple parallel connectors, as discussed herein.

In reference to FIG. 5C, the two baseboards 40A, 40B can be moved away by actuating the four linear actuators. Then a daughterboard can be removed, or attached to one of the two baseboards. Next, the two baseboards 40A, 40B are brought closer by actuating again on the four linear actuators until the daughterboards are safely attached to the baseboards. During this operation of removing or adding a daughterboard, the two baseboards may remain substantially parallel, e.g., by actuating the four linear actuators the same way and at the same time.

The linear actuators 30 may be lead screw actuators 30 that are actuated upon user action with a screwdriver. For instance, the screw may have parameters that include a diameter (d) of 3 millimeters and a pitch/lead (l) of 0.35 millimeters (e.g., an M3 ISO standard thread). It is to be understood that parameter values of the screw are not limited to these examples and that any parameter value may be suitable. The screwdriver may be a dynamometric screwdriver with a range of torque selected so that the daughterboards, connectors, and/or card slots of the baseboards are not damaged by an excessive pressure due to the actuator. This range of torque may notably depend on the screw parameters, on a friction coefficient (fc) between the parts of the actuator, and on the insertion force (F) necessary to connect a daughterboard on a card slot. Hence, an approximate torque (T) may be computed with the formula $$T = 0.5 * F * d * \tan\left(\mathrm{atan}(fc) + \mathrm{atan}\left(\frac{l}{\pi * d}\right)\right),$$

wherein d is the diameter of the screw, fc is the friction coefficient, F is the insertion force for n card slots, and l is the pitch/lead. F depends on the type and number of slots that are on the baseboard. For instance, in embodiments the insertion force of one standard DIMM3 connector is 66.7 Newton for a connector area of 7.75×133.75 millimeters. For sixteen standard DIMM3 connectors, the insertion force F is F=66.7*16=1067.2 Newton, and this value reported in the formula T results in the approximate torque T=0.46 Newton meter. Thus, the range of torque in this example may preferably be 0.3-0.6 Newton meter.

In another embodiment, the linear actuators 30 may be motorized lead screw actuators 30. The movements of the linear actuators may be controlled by a motor that is configured to apply a torque on each screw that does not exceed the allowed limits, e.g., a torque range 0.3-0.6 Newton meter.

Now in reference to FIG. 5B, each baseboard 40A, 40B comprises six card slots mounted in parallel so that up to six daughterboards 50 can be mounted in the device 10. It is to be understood that the number of card slots is only a design choice which depends in particular on the size of the baseboard. In embodiments, the number of daughterboards a baseboard can accept may be limited by the insertion force which translates, on one hand, into the torque to be applied on the screws and, on the other hand, must be compatible with the flexural strength of the PCB. Said otherwise, this means that the number of daughterboards may depend on the maximum torque one can actuate and the material of the PCB.

The acceptance a large number of daughterboards may also depend on the flexural strength of each baseboard. Flexural strength and resistance of a PCB can be modeled with mathematical modeling tools, e.g., Timoshenko plate model, finite elements analysis. In practice, flexural strength of the baseboard may depend on the material from which the baseboard is constructed and also on other parameters such as the laminate thickness of the baseboard. For example, a baseboard made of a primary resin system of difunctional epoxy, a secondary resin system of multifunctional epoxy, and a reinforcement of woven E-glass and with a laminate value larger than 0.5 millimeters, should have a minimal flexural strength in the cross direction of about 345 Newton per square millimeter, and a minimal flexural strength in the length direction of about 415 Newton per square millimeter.

Figure 6:
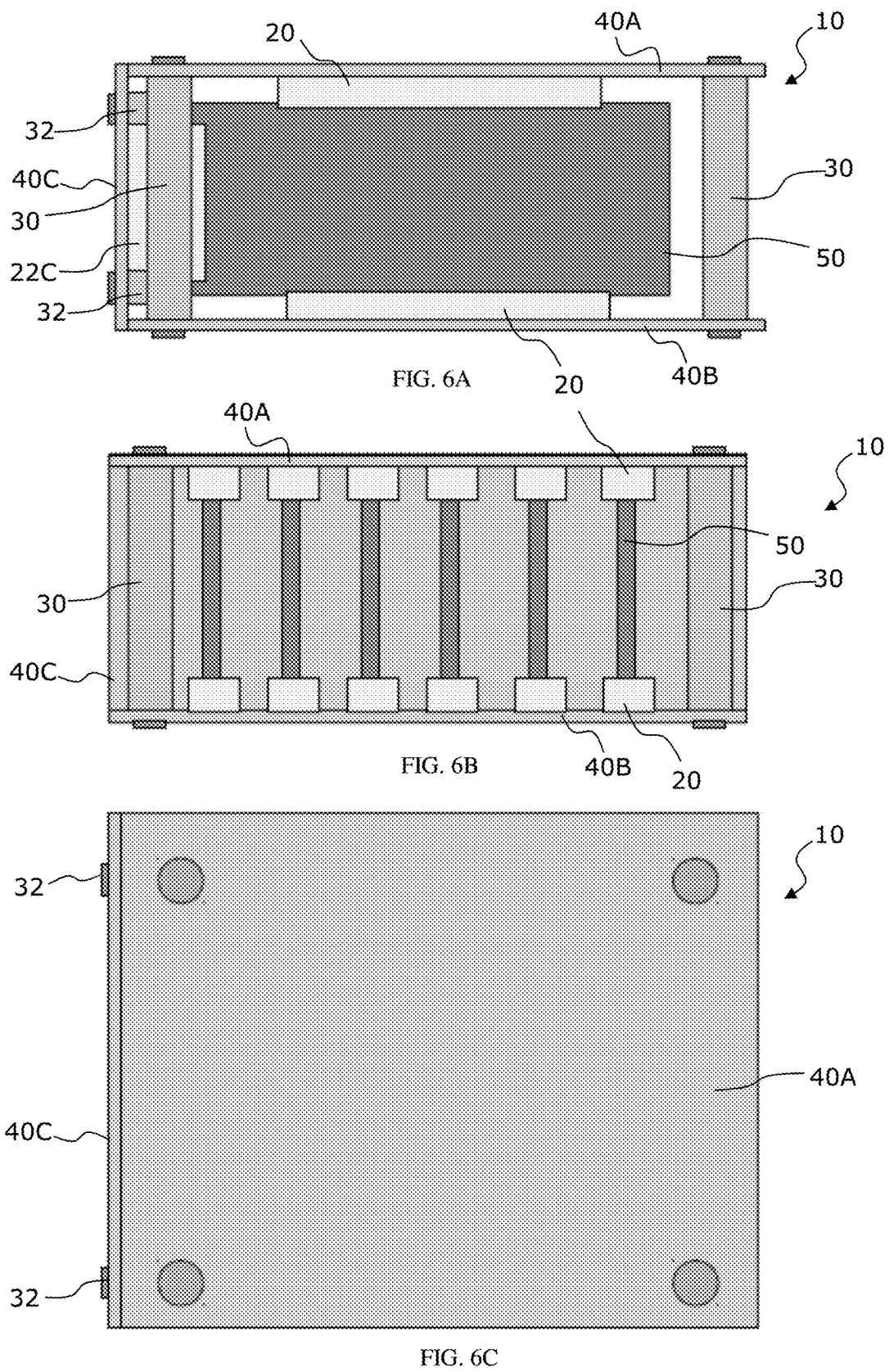
FIGS. 6A, 6B, and 6C show views of an embodiment of the invention for a daughterboard with three connectors.

Referring now to FIGS. 6A-6C, an embodiment of a device 10 is represented. As represented the device 10 comprises six three-sided daughterboards 50. FIG. 6A is a front view, FIG. 6B is a side view, and FIG. 6C is a top view of the device 10. In this example, the connector of a first side (e.g., the top side) of the daughterboard is connected to a first baseboard (e.g., 40A), the connector of a second side (e.g., the bottom side) of the daughterboard is connected to a second baseboard (e.g., 40B), and the connector of a third side (e.g., the left side or the right side) is connected to a third baseboard (e.g., 40C). The device 10 of FIGS. 6A-6C is thus similar to embodiments of the one represented in FIGS. 5A-5C, except that it comprises an additional baseboard 40C, a daughterboard 50 with three connectors, and further mechanical parts 32 for securing the baseboard 40C in alignment with the connector of the third side and ensuring that the third connector is in contact with the card slot of this third baseboard. In embodiments, the additional baseboard 40C, the third connector 22C, and the further mechanical parts 32 may have the same characteristics as discussed in reference to FIGS. 5A-5C.

Still in reference to FIG. 6C, the two baseboards 40A, 40B can be moved away by actuating the four linear actuators 30. The third baseboard can also be moved away from the two other baseboards by actuating the two linear actuators 32. Then a daughterboard can be removed or attached to one of the three baseboards, preferably to the baseboards 40A or 40B. Next, the two baseboards 40A, 40B are brought closer by actuating on the four linear actuators 30 until the daughterboards are safely attached to these two baseboards. Then, the third baseboard is brought closer by actuating on the linear actuators 32 until the connector 22C of the daughterboard is safely attached to the card slot of the third baseboard 40C. Preferably, the third baseboard 40C is removed before the two other baseboards have been removed, and it is brought closer after the two other baseboards have been brought closer. This may prevent too much mechanical force from being applied on the connectors and the card slots.

In the embodiments described in reference to FIGS. 5A-5C, 6A-6C, the device 10 comprises two or more baseboards that may be communicatively coupled to each other. For instance, each baseboard may comprise at least one processor 605 communicatively coupled with a memory 610 and include a network interface or transceiver for coupling them, as described in reference to FIG. 7.

In embodiments, the daughterboard may comprise at least one processor 605 communicatively coupled with a memory 610. For instance, the daughterboard may be a graphical card. As another example, the daughterboard may be a computerized unit as described in reference to FIG. 7.

The device 10 may be mounted on a rack-mount to be placed in a rack, as known in the art.

The device 10 may be a blade server wherein each baseboard provides non-core computing services such as power or networking to the daughterboards that are enclosed in blade enclosures with two or more connectors that are attached to the baseboards.

Figure 7:
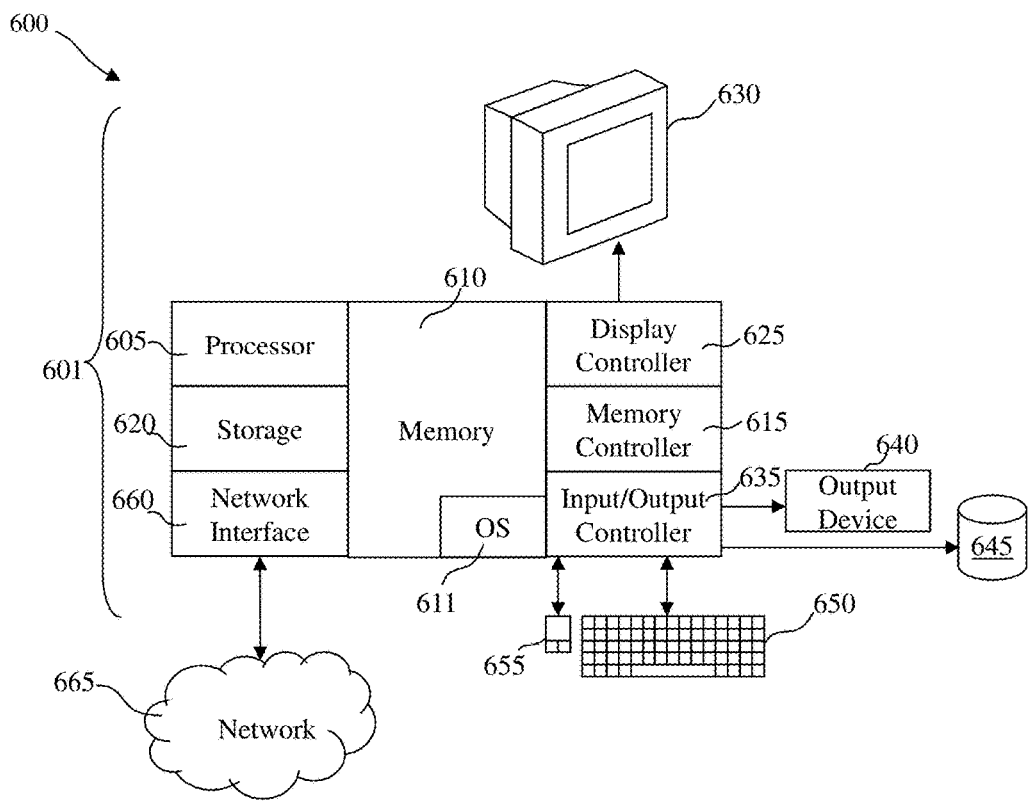
FIG. 7 shows an example of a computer system.

The system 600 depicted in FIG. 7 schematically represents a computerized unit 601, e.g., a general-purpose computer. In exemplary embodiments, in terms of hardware architecture, as shown in FIG. 7, the unit 601 includes a processor 605, memory 610 coupled to a memory controller 615, and one or more input and/or output (I/O) devices 640, 645, 650, 655 (or peripherals) that are communicatively coupled via a local input/output controller 635. Further, the input/output controller 635 may be, but is not limited to, one or more buses or other wired or wireless connections, as is known in the art. The input/output controller 635 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 605 is a hardware device for executing software, particularly that stored in memory 610. The processor 605 may be any custom made or commercially available processor, a central processing unit (CPU), an auxiliary processor among several processors associated with the computer 601, a semiconductor based microprocessor (in the form of a microchip or chip set), or generally any device for executing software instructions.

The memory 610 may include any one or combination of volatile memory elements (e.g., random access memory) and nonvolatile memory elements. Moreover, the memory 610 may incorporate electronic, magnetic, optical, and/or other types of storage media. Note that the memory 610 may have a distributed architecture, where various components are situated remote from one another, but may be accessed by the processor 605.

The software in memory 610 may include one or more separate programs, each of which comprises an ordered listing of executable instructions for implementing logical functions. In the example of FIG. 7, the software in the memory 610 include may include instructions for carrying out a method described herein in accordance with exemplary embodiments and a suitable operating system (OS) 611. The OS 611 essentially controls the execution of other computer programs, and provides scheduling, input-output control, file and data management, memory management, and communication control and related services.

Possibly, a conventional keyboard 650 and mouse 655 may be coupled to the input/output controller 635. Other I/O devices 640-655 may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 635 for further processing. Sensor nodes are ideally small, consume low energy, are autonomous and operate unattended.

In addition, the I/O devices 640-655 may further include devices that communicate both inputs and outputs. The system 600 may further include a display controller 625 coupled to a display 630. In exemplary embodiments, the system 600 may further include a network interface or transceiver 660 for coupling to a network 665.

The network 665 transmits and receives data between the unit 601 and external systems. The network 665 is possibly implemented in a wireless fashion, e.g., using wireless protocols and technologies, such as WiFi, WiMax, etc. The network 665 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 665 may also be an IP-based network for communication between the unit 601 and any external server, client and the like via a broadband connection. In exemplary embodiments, network 665 may be a managed IP network administered by a service provider. Besides, the network 665 may be a packet-switched network such as a LAN, WAN, Internet network, etc.

If the unit 601 is a PC, workstation, intelligent device or the like, the software in the memory 610 may further include a basic input output system (BIOS). The BIOS is stored in ROM so that the BIOS may be executed when the computer 601 is activated.

When the unit 601 is in operation, the processor 605 is configured to execute software stored within the memory 610, to communicate data to and from the memory 610, and to generally control operations of the computer 601 pursuant to the software. The instructions described herein and the OS 611, in whole or in part are read by the processor 605, typically buffered within the processor 605, and then executed. When the methods described herein are implemented in software, the methods may be stored on any computer readable medium, such as storage 620, for use by or in connection with any computer related system or method.

Figure 8:
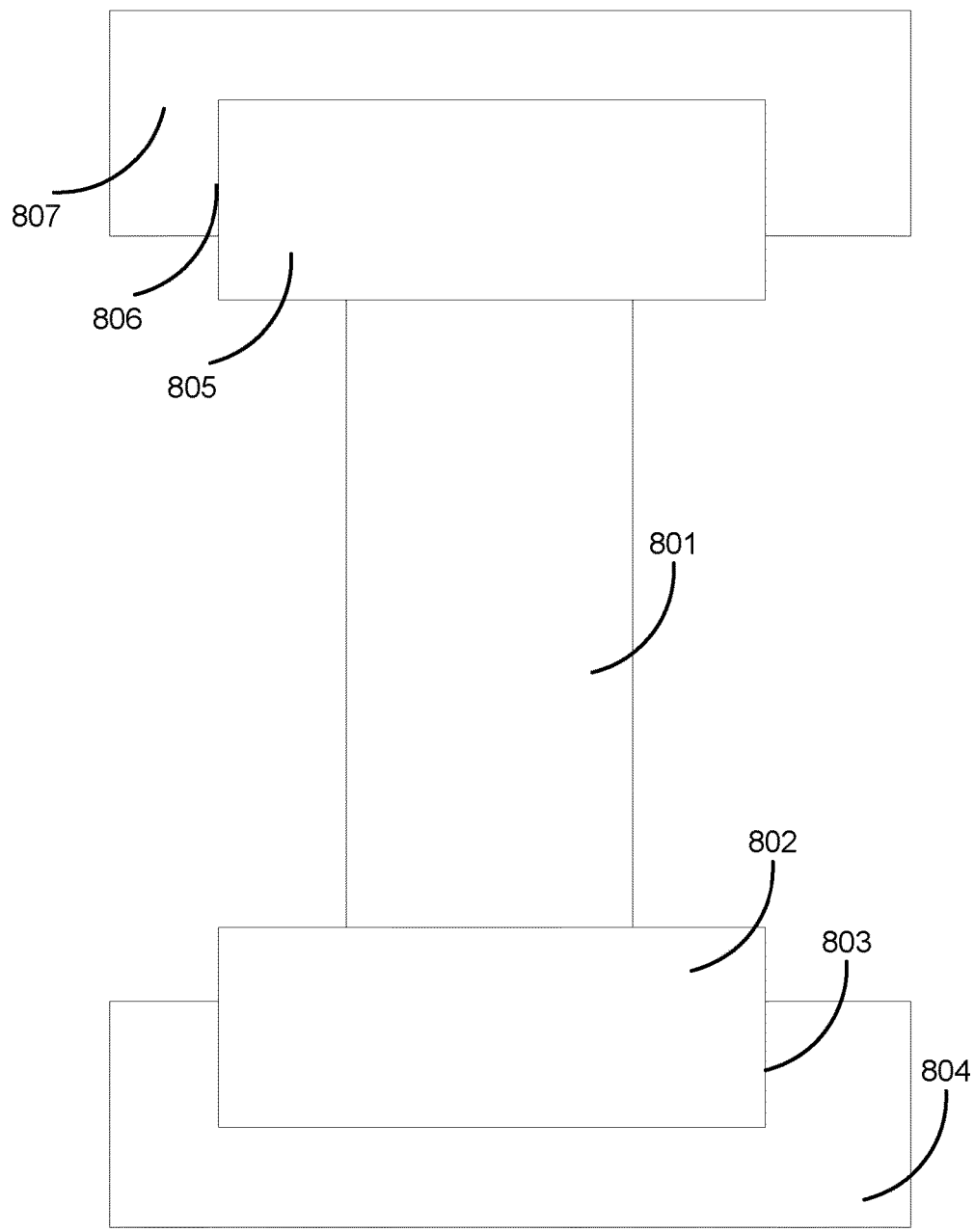
FIG. 8 shows an example of a daughterboard having connectors coupled to card slots.

Referring now to FIG. 8, shown is an embodiment of a daughterboard having connectors coupled to card slots. Specifically, daughterboard 801 has a first connector 802 and a second connector 805. The first connector 802 is attached to a first card slot 804 via a first circuit 803. The second connector 805 is attached to a second card slot 807 via a second circuit 806.

The figures illustrate the architecture, functionality, and operation of possible implementations of the device according to various embodiments of the present invention. More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope.

Therefore, it is intended that the present invention not be limited to the particular embodiments disclosed, but that the present invention will include all embodiments falling within the scope of the appended claims.

What is claimed is:
1. A device comprising:
   a daughterboard including a first distinct side and a second distinct side;
   a first electrical connector on the first distinct side, the first electrical connector attached to a first baseboard, wherein the first baseboard comprises a first processor communicatively coupled with a first memory; and
   a second electrical connector on the second distinct side, the second electrical connector attached to a second baseboard, wherein the second baseboard comprises a second processor communicatively coupled with a second memory.

2. The device of claim 1, wherein the daughterboard further includes a third distinct side and a fourth distinct side.

3. The device of claim 1, wherein the first connector is in alignment with the first baseboard, and wherein the second connector is in alignment with the second baseboard.

4. The device of claim 3, wherein the first baseboard is communicatively coupled with the second baseboard.

5. The device of claim 1, wherein the first baseboard comprises a first card slot for attaching the first connector, and wherein the second baseboard comprises a second card slot for attaching the second connector.

6. The device of claim 5, wherein the first baseboard comprises a third card slot attached to the first baseboard in parallel to the first card slot, and wherein the second baseboard comprises a fourth card slot attached to the second baseboard in parallel to the second card slot.

7. The device of claim 5, wherein the first card slot and second card slot are dual in-line memory modules (DIMMs).

8. The device of claim 5, wherein the first card slot is attached to the first connector via a first circuit, and wherein the second card slot is attached to the second connector via a second circuit.

9. The device of claim 3, wherein the first distinct side and the second distinct side are opposite sides of the daughterboard, and wherein the first baseboard and the second baseboard are positioned opposite each other relative to the daughterboard.

10. The device of claim 9, wherein the daughterboard further includes a third connector located on a third distinct side, the third distinct side connecting the first distinct side and the second distinct side, and wherein a third baseboard is positioned in alignment with the third connector.

11. The device of claim 9, wherein the first baseboard and the second baseboard are mechanically secured to each other by one or more linear actuators.

12. The device of claim 11, wherein the one or more linear actuators are lead screw actuators.

13. The device of claim 1, further comprising:
a second daughterboard including a third distinct side and a fourth distinct side;
a third connector on the third distinct side, the third connector attached to the first baseboard; and
a fourth connector on the fourth distinct side, the fourth connector attached to the second baseboard,
wherein the first daughterboard and second daughterboard are positioned parallel to each other between the first baseboard and the second baseboard.

14. The device of claim 1, wherein the daughterboard comprises at least one processor communicatively coupled with a memory.

15. The device of claim 1, wherein the device is a blade server, wherein the first baseboard and the second baseboard each provide non-core computing services to the daughterboard, and wherein the daughterboard is enclosed within the blade server.

16. A method for attaching a daughterboard to a device, the daughterboard including a first electrical connector on a first distinct side of the daughterboard and a second electrical connector on a second distinct side of the daughterboard opposite the first distinct side, the device including a first baseboard mechanically secured in parallel with a second baseboard by one or more lead screw actuators, the first baseboard comprising a first processor communicatively coupled with a first memory, the second baseboard comprising a second processor communicatively coupled with a second memory, the method comprising:
actuating the one or more lead screw actuators to move the first baseboard away from the second baseboard;
attaching the first electrical connector to a first card slot of the first baseboard; and
actuating the one or more lead screw actuators to move the first baseboard toward the second baseboard until the second electrical connector is brought into attachment with a second card slot of the second baseboard.

17. The method of claim 16, wherein the device is a blade server, wherein the first baseboard and the second baseboard each provide non-core computing services to the daughterboard, and wherein the daughterboard is enclosed within the blade server.

* * * * *